United States Patent [19]
Dibbern et al.

[11] Patent Number: 5,721,464
[45] Date of Patent: Feb. 24, 1998

[54] PIEZOELECTRIC ELEMENT

[75] Inventors: Uwe Dibbern, Hamburg; Detlev Hennings, Aachen, both of Germany; Johan W. C. De Vries, Eindhoven, Netherlands

[73] Assignee: U.S. Philips Corporation, New York, N.Y.

[21] Appl. No.: 664,072

[22] Filed: Jun. 13, 1996

[30] Foreign Application Priority Data

Jun. 19, 1995 [EP] European Pat. Off. ............ 95201640

[51] Int. Cl.$^6$ ...................................................... H01L 41/08
[52] U.S. Cl. .......................... 310/358; 310/366; 252/62.9
[58] Field of Search ................................ 36/311, 328, 358, 36/359, 366; 29/25.35; 252/62.9; 156/89; 264/56, 58, 61

[56] References Cited

U.S. PATENT DOCUMENTS

| | | | |
|---|---|---|---|
| 4,564,782 | 1/1986 | Ogawa | 310/359 |
| 4,918,350 | 4/1990 | Ando et al. | 310/358 X |
| 5,463,266 | 10/1995 | Fukuoka et al. | 310/359 |
| 5,507,898 | 4/1996 | Aoki et al. | 156/89 |

OTHER PUBLICATIONS

"PZT-Based Multilayer Piezoelectric Ceramics with AgPd-Internal Electrodes", by W. Wersing et al, Ferroelctrics, 1988, vol. 87, pp. 271–294.

*Primary Examiner*—Mark O. Budd
*Attorney, Agent, or Firm*—Daniel E. Tierney

[57] ABSTRACT

The invention provides a novel type of piezoelectric element. This element comprises a number of piezoelectric layers of a ceramic material and a number of electrode layers of a silver-palladium alloy. The piezoelectric layers and the electrode layers are stacked alternately to form a multilayer. This multilayer is also provided with at least two external electrical connections which are in contact with a number of said electrode layers. In accordance with the invention, the composition of the main component of the ceramic material corresponds to the formula:

$$[Pb_{1-u-x}Ag_uRE_x][Ti_{1-y-z}Zr_y(W_{1/2}Mg_{1/2})_z]O_3,$$

where RE is at least one element selected from the group formed by La, Nd, Sm and Gd, and in which $0<u\leq0.025$; $0.005\leq x\leq0.05$; $0.44\leq y\leq0.52$ and $0.015\leq z\leq0.1$. Preferably, RE stands for La and $0.005<u<0.020$. This material can be sintered at a low temperature and has a relatively high Curie temperature. It has further been found that the temperature-dependence of the piezoelectric properties is relatively small in the range around 150° C. The invention also provides a method of manufacturing said piezoelectric elements as well as a novel ceramic composition having piezoelectric properties.

16 Claims, 1 Drawing Sheet

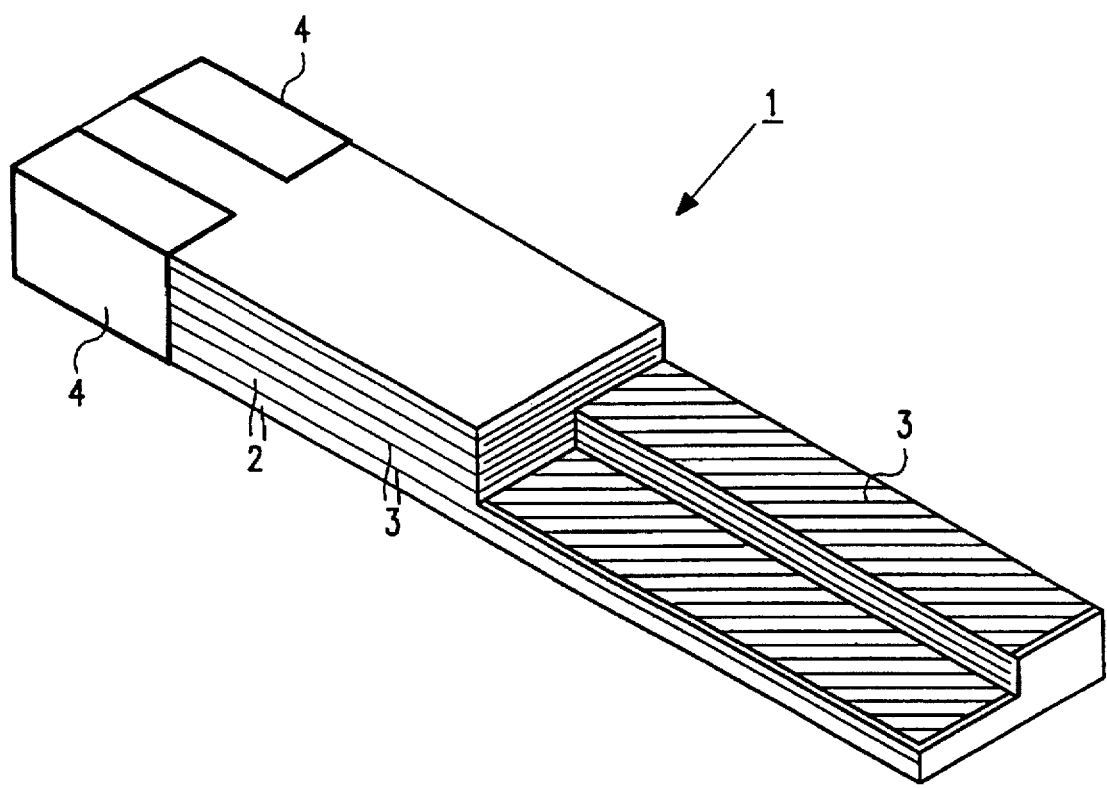

PIEZOELECTRIC ELEMENT

The invention relates to a piezoelectric element comprising a number of piezoelectric layers of a ceramic material and a number of electrode layers of a silver-palladium alloy, said piezoelectric layers and said electrode layers being stacked alternately to form a multilayer which is also provided with at least two external electrical connections which are in contact with a number of said electrode layers. The invention further relates to a method of manufacturing such a piezoelectric element. The invention also relates to a ceramic material which can suitably be used in a piezoelectric element.

The use of piezoelectric elements is based on the fact that the piezoelectric material used in said elements has the property of converting an electric potential difference to a mechanical deformation and conversely. By virtue of this property such elements can be used for many applications. Said elements are for example used as sensors for detecting mechanical and acoustic signals. In addition, piezoelectric elements are also often used as actuators in which a voltage applied to the element is converted to a mechanical deformation.

Piezoelectric elements must meet a large number of requirements which are often lacking in compatibility. These requirements are often defined by means of so-called "piezoelectric parameters". In genereal, these parameters are highly dependent upon the composition of the ceramic material and upon the operating temperature of the element. Important piezoelectric parameters are the charge constant d, the coupling factor k, the dielectric constant $\epsilon/\epsilon_o$ and the Curie temperature $T_c$. The charge constant d represents the ratio between the relative mechanical expansion of the material S and the applied field strength E in accordance with the formula S=d.E. The square of the coupling factor k is a measure of the conversion of electric energy into mechanical energy or conversely. Above the Curie temperature the piezoelectric material loses its piezoelectric properties completely and irreversibly.

A piezoelectric element of the type mentioned in the opening paragraph is known per se, inter alia, from "Ferroelectrics", 1988, Vol. 87, pp. 271–294. In said document a description is given of a piezoelectric element of the multilayer type which is composed of electrode layers of a palladium-silver alloy and dielectric layers based on lead-zirconium-titanate (PZT).

As is described in said document, the use of a PZT-based ceramic material in such multilayer elements often leads to problems. An important problem relates to the compatibility of the ceramic material with the material of the electrodes. More in particular the relatively high sinter temperature of the known ceramic materials proves to be an important drawback. This sinter temperature is generally 1200° C. or higher. At said high temperatures the customary ceramic materials react with the electrode material. As a result, the customary silver-palladium alloys are not very suitable for use in these multilayer elements. A further drawback of the known piezoelectric element relates to the Curie temperature. Often the Curie temperature does not exceed 200° to 250° C. For many applications of the piezoelectric elements, however, a higher Curie temperature is desired.

It is an object of the invention to provide a piezoelectric element of the type mentioned in the opening paragraph, which does not have the above-mentioned drawbacks. The invention more particularly aims at providing a piezoelectric element which can be sintered at lower temperatures. The expression "lower temperature" is to be understood to mean herein a temperature of 1150° C. or less. In addition, the piezoelectric element in accordance with the invention must have a relatively high Curie temperature, preferably above 250° C. in particular above 300° C. The temperature dependence of the piezoelectric parameters of the elements in accordance with the invention should be relatively small in the temperature range around 150° C.

These and other advantages of the invention are achieved by a piezoelectric element, which is characterized in accordance with the invention in that the composition of the main component of the ceramic material corresponds to the formula

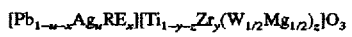

$$[Pb_{1-u-x}Ag_uRE_x][Ti_{1-y-z}Zr_y(W_{1/2}Mg_{1/2})_z]O_3$$

where RE is at least one element selected from the group formed by La, Nd, Sm and Gd, and in which $0<u\leq0.025$; $0.005\leq x\leq0.05$; $0.44\leq y\leq0.52$ and $0.015\leq z\leq0.1$.

The rare earth (RE) elements which can be used are lanthanum (La), neodymium (Nd), samarium (Sin), gadolinium (Gd) or a combination of two or more of these elements. If the only rare earth element used is La, then a cost reduction is achieved because La is relatively cheap. The quantity of RE must exceed 0.005. A smaller quantity of RE causes the piezoelectric effect of the inventive element to be insufficient. If x=0, the material is difficult to polarize and the coupling factors $k_p$, $d_{31}$ and $d_{33}$ are relatively small. In addition, under these conditions the insulation resistance of the material is too low. However, the quantity of RE must be less than 0.05. A larger quantity of RE has the adverse effect that the Curie temperature decreases rapidly.

The ratio of RE to Ag is preferably chosen to be such that Ag/RE <1. In this case, the ceramic material comprises an excess of bivalent Pb. This has the important advantage that the sinter temperature is reduced while, simultaneously, a higher density is achieved. The evaporation of PbO during the sintering operation is compensated for by an excess of PbO, which is added in advance.

The piezoelectric elements in accordance with the invention exhibit a surprisingly low sinter temperature. For example, sinter temperatures of 1100° C. and even 1075° C. can be used without problems to manufacture the piezoelectric elements in accordance with the invention. At said temperatures the grain growth of the ceramic material having the above composition is very small. The sinter densities which can be attained with these materials are also relatively high. The invention is inter alia based on the recognition that a small, yet effective, quantity of silver leads to a substantial reduction of the sinter temperature of the material. An Ag concentration in excess of 0.025 has the adverse effect that the insulation resistance of the material is reduced to an unacceptable level. Optimally suited piezoelectric elements are obtained if the quantity of silver in the ceramic material ranges from 0.005 to 0.020 at. %.

It has been found that the materials in accordance with the invention have a relatively high Curie temperature, i.e. above 250° C., in many cases even above 300° C. It has further been found that the temperature dependence of the piezoelectric parameters is relatively small around 150° C. By virtue of these advantages, the elements in accordance with the invention can suitably be used at temperatures in the range from 125° to 175° C. or higher. For example, if they are used in combustion engines they are exposed to temperatures above 175° C.

It is noted that by substituting bivalent lead (Pb) with one or more of the above-mentioned trivalent rare-earth elements (RE), always 1.5 atoms Pb are replaced by 1 atom of RE on the grounds of charge. On the other hand, by substituting also a small part of the bivalent lead with monovalent silver (Ag), always 1 atom of Pb is replaced by 2 atoms of Ag on the grounds of charge. These two charge effects largely counteract each other. The excess of Pb due to the RE substitution is compensated for by the deficiency of Pb due to the incorporation of Ag in the perovskite lattice.

In accordance with a preferred embodiment of the invention, the ceramic material of the inventive piezoelectric element also comprises a small, yet effective, quantity of 5.PbO.WO$_3$. This material serves as a sintering agent. It causes the sinter temperature of the ceramic material to be further reduced. The effect of this sintering agent on the piezoelectric parameters of the final element are negligibly small. Optimum quantities of the sintering agent range from 0.1 to 1.0 mol. %, calculated on the main component of the ceramic material.

The invention also relates to a method of manufacturing a piezoelectric element. This method is characterized in that it comprises the following steps:

screen printing electrode layers on a ceramic foil by means of a silver-palladium paste, stacking a number of these foils to form a multilayer, compressing and calcining the multilayer, sintering the multilayer, dividing the multilayer into individual multilayer elements, providing electrical connections on one or more side faces of the multilayer elements, polarizing the multilayer elements, characterized in that the ceramic foil comprises a ceramic material whose composition corresponds to the formula:

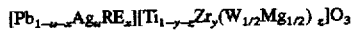

where RE is at least one element selected from the group formed by La, Nd, Sm and Gd, and in which $0<u\leq0.025$; $0.005\leq x\leq0.05$; $0.44\leq y\leq0.52$ and $0.015\leq z\leq0.1$, and in that sintering is carried out at a temperature below 1150° C.

In accordance with a preferred embodiment of the method in accordance with the invention, the ceramic material also comprises 0.1 to 1.0 mol. % 5.PbO.WO$_3$. By virtue of this addition the low sinter temperatures of the piezoelectric elements, which are made possible by the composition of the main component, are further reduced.

The invention also relates to a ceramic material which is suitable for use in a piezoelectric element. In accordance with the invention, this material is characterized in that the composition of the main component of the ceramic material corresponds to the formula:

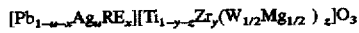

wherein RE is at least one element selected from the group formed by La, Nd, Sm and Gd, and in which $0<u\leq0.0025$; $0.005\leq x\leq0.05$; $0.44\leq y\leq0.52$ and $0.015\leq z\leq0.1$. Preferably, the material comprises almost exclusively La as the rare earth metal. The silver content of the ceramic material in accordance with the invention preferably ranges from 0.5 to 2.0 at. % ($0.005<u<0.020$). The material in accordance with the invention comprises, in addition to the main component, preferably 0.1 to 1.0 mol % of a sintering agent of the type 5PbO.WO$_3$.

These and other aspects of the invention will be apparent from and elucidated with reference to the embodiments described hereinafter.

In the drawings:

The sole FIGURE shows a piezoelectric element in accordance with the invention.

It is noted that, for clarity, the various parts of the FIGURE are not drawn to scale.

The FIGURE schematically shows a piezoelectric element 1 in accordance with the invention. For clarity, a part of the element is shown in a cutaway view. The element 1 comprises a number of piezoelectric layers of a ceramic material 2 and a number of electrode layers 3 of a silver-palladium alloy (70/30 wt. %), the piezoelectric layers and the electrode layers being stacked alternately to form a multilayer. To simplify the drawing, only approximately 10 piezoelectric layers and 10 electrode layers are shown. In reality, the multilayer is composed of minimally 25 and preferably more than 100 layers. The layer thickness of the ceramic layers typically is 5 to 50 micrometers. In this case the layer thickness was 15 micrometers. The layer thickness of the electrode layers typically is 1 to 3 micrometers. In this case the layer thickness was 2 micrometers.

The piezoelectric element shown in FIG. 1 also comprises two external electrical connections 4 which are in contact with a number of the electrode layers. These connections are made from vapour-deposited CrNi-Au layers. The element shown is of the D31 type. Under the influence of a voltage which is applied across the connections, this type of element exhibits a substantially longitudinal, mechanical deformation. A piezoelectric element of this type requires only two external electrical connections. The invention can also be used, however, in piezoelectric elements having more than two external electrical connections. An element with three connections is shown in the above-mentioned prior art.

The ceramic material of the piezoelectric layers corresponds to the formula [Pb$_{1-u-x}$Ag$_u$RE$_x$][Ti$_{1-y-z}$Zr$_y$(W$_{1/2}$Mg$_{1/2}$)$_z$]O$_3$, where RE is at least one element selected from the group formed by La, Nd, Sm and Gd, and in which $0<u\leq0.025$; $0.005\leq x\leq0.05$; $0.44\leq y\leq0.52$ and $0.015\leq z\leq0.1$. For the elements with the best properties the following applies: RE is equal to La and $0.05<u<0.020$. The presence of this type of material provides the piezoelectric element with a surprisingly high Curie temperature and a relatively high density.

The piezoelectric element was manufactured as follows. First, a ceramic foil of a piezoelectric material was manufactured in a thickness of approximately 40 micrometers. This foil was obtained by suspending a quantity of the relevant metal oxides (Merck, analytical re-agent quality) in powdered form in the ratio corresponding to the desired composition in isopropanol, whereafter the suspension thus formed was ground intensively in a ball mill for 6 hours. After the grinding operation, the isopropanol was removed by drying the mixture at 120° C. The dry mixture was subsequently calcined in air at 800° C. for 12 hours. A small quantity of a sintering agent was subsequently added to this calcined mixture. This addition can also take place before the calcining step.

Next, the calcined powder mixture and the sintering agent were suspended together in isopropanol and ground in a ball mill (ball diameter 2 mm) for 20 hours. The ground suspension was subsequently cast so as to form a foil. The dried foil was provided with an electrode structure by means of screen printing. To this end, a screen-printing paste containing silver-palladium was used. After drying of the paste, a number of foils was stacked to form a multilayer having a desired electrode structure. The multilayer was calcined to remove any binder residues, and subsequently compressed. Next, the multilayer was sintered for 2 hours in an oxygen atmosphere at a temperature below 1150° C. After cooling, the sintered multilayer was divided into individual multilayer elements. These elements were provided with external electrical connections. Finally, the individual elements were polarized.

In a representative exemplary embodiment the starting material was composed of a powder mixture of 219.192 g lead oxide (PbO), 2.444 g lanthanum oxide ($La_2O_3$), 55.585 g titanium oxide ($TiO_2$), 60.378 g zirconium oxide ($ZrO_2$), 5.797 g tungsten oxide ($WO_3$), 1.008 g magnesium oxide ($Mg_O$) and 0.695 g silver oxide ($Ag_2O$). After the calcining operation, a mixture of 3.35 g PbO and 0.695 g $WO_3$ was added as the sintering agent. After the above process steps, the composition of the final, sintered product was analyzed. This composition corresponded to the formula $[Pb_{0.977}Ag_{0.008}La_{0.015}][Ti_{0.46}Zr_{0.49}(W_{1/2}Mg_{1/2})_{0.05}]O_3$.+ 0.003 ($5PbO.WO_3$). The analytical error is approximately 0.5 at. %.

A large number of piezoelectric compounds having a composition similar to that of the representative exemplary embodiment were manufactured by small variations in the quantities of the weighed-in metal oxides. By means of various kinds of measurements on these compounds, it could be calculated that the quantities of weighed-in lead oxide, rare-earth oxide, titanium oxide, zirconium oxide, tungsten oxide, magnesium oxide and silver oxide should be selected so that the metal contents (at. %) of the eventually formed perovskite compound fall within the indicated limits. Thus, for the final perovskite compound $[Pb_{1-u-x}Ag_uRE_x][Ti_{1-y-z}Zr_y(W_{1/2}Mg_{1/2})_z]O_3$ the following relationships apply: $0 < u \leq 0.025$; $0.005 \leq x \leq 0.05$; $0.44 \leq y \leq 0.52$ and $0.015 \leq z \leq 0.1$.

The density-increasing effect of a small quantity of Ag was demonstrated by means of the following compounds: $[Pb_{0.985}La_{0.015}][Ti_{0.46}Zr_{0.49}(W_{1/2}Mg_{1/2})_{0.05}]O_3$ to which 0.003 mol. % ($5PbO.WO_3$) was added (exemplary embodiment I) and $[Pb_{0.977}Ag_{0.008}La_{0.015}][Ti_{0.46}Zr_{0.49}(W_{1/2}Mg_{1/2})_{0.05}]O_3$ to which 0.003 mol. % ($5PbO.WO_3$) was added (exemplary embodiment II). Compressed powder mixtures of the metal oxides of these compounds were sintered at different temperatures for 1 hour. Subsequently, the density d ($g/cm^{-3}$) of the sintered bodies was determined. The results of this measurement are listed in Table 1.

TABLE 1

| T (°C.) | I | II |
| --- | --- | --- |
| 1050 | 7.37 | 7.50 |
| 1060 | 7.45 | 7.62 |
| 1070 | 7.55 | 7.70 |
| 1080 | 7.64 | 7.80 |
| 1090 | 7.72 | 7.88 |
| 1100 | 7.80 | 7.94 |
| 1110 | 7.88 | 7.99 |
| 1120 | 7.95 | 8.12 |
| 1130 | 8.05 | 8.15 |
| 1140 | 8.10 | 8.12 |

Table 1 clearly shows that a small quantity of silver leads to an increase of the density of the sintered piezoelectric material if the material is treated under identical conditions (equal sinter temperature and equal sinter time).

The fact that a small quantity of silver hardly adversely affects the properties of the piezoelectric material is shown by the data in Tables 2 and 3. The compound used for this purpose was $[Pb_{1-u-x}Ag_uLa_x][Ti_{1-y-z}Zr_y(W_{1/2}Mg_{1/2})_z]O_3$ to which 0.003 mol. % ($5PbO.WO_3$) was added. Table 2 lists the values of u, x, y and z for six compounds in which particularly the silver content has been varied. Table 3 lists the corresponding properties of said six compounds. The compounds were sintered at 1075° C.

TABLE 2

|   | x | y | z | u |
| --- | --- | --- | --- | --- |
| 1 | 0.03 | 0.46 | 0.10 | 0 |
| 2 | 0.03 | 0.46 | 0.10 | 0.003 |
| 3 | 0.03 | 0.46 | 0.10 | 0.006 |
| 4 | 0.03 | 0.46 | 0.10 | 0.009 |
| 5 | 0.03 | 0.46 | 0.10 | 0.012 |
| 6 | 0.03 | 0.46 | 0.10 | 0.015 |

TABLE 3

|   | d | $T_c$ | tan δ | $k_p$ | $k_{31}$ | $d_{31}$ |
| --- | --- | --- | --- | --- | --- | --- |
| 1 | 8.060 | 212 | 2850 | 23 | 0.66 | 0.39 | 238 |
| 2 | 8.029 |     | 2770 | 21 | 0.63 | 0.36 | 218 |
| 3 | 8.029 |     | 2780 | 20 | 0.65 | 0.37 | 222 |
| 4 | 8.030 |     | 2610 | 21 | 0.64 | 0.34 | 214 |
| 5 | 8.035 |     | 2930 | 21 | 0.35 | 0.19 | 120 |
| 6 | 8.028 |     | 3190 | 18 | 0.39 | 0.21 | 140 |

The invention provides a novel type of piezoelectric multilayer element, a method of manufacturing this element as well as a novel piezoelectric ceramic material. This material is characterized in that the composition of the main component of the ceramic material corresponds to the formula $$[Pb_{1-u-x}Ag_uRE_x][Ti_{1-y-z}Zr_y(W_{1/2}Mg_{1/2})_z]O_3,$$

where RE is at least one element selected from the group formed by La, Nd, Sm and Gd, and in which $0 < u \leq 0.025$; $0.005 \leq x \leq 0.05$; $0.44 \leq y \leq 0.52$ and $0.015 \leq z \leq 0.1$. Preferably, RE stands for La and $0.005 < u \leq 0.020$. This material can be sintered at a low temperature and has a relatively high Curie temperature. It has further been found that the temperature dependence of the piezoelectric properties is relatively small in the range around 150° C.

We claim:

1. A piezoelectric element comprising a number of piezoelectric layers of a ceramic material and a number of electrode layers of a silver-palladium alloy, said piezoelectric layers and said electrode layers being stacked alternately to form a multilayer which is also provided with at least two external electrical connections which are in contact with a number of said electrode layers, characterized in that the composition of the main component of the ceramic material corresponds to the formula:

$$[Pb_{1-u-x}Ag_uRE_x][Ti_{1-y-z}Zr_y(W_{1/2}Mg_{1/2})_z]O_3$$

where RE is at least one element selected from the group formed by La, Nd, Sm and Gd, and in which $0 < u \leq 0.025$; $0.005 \leq x \leq 0.05$; $0.44 \leq y \leq 0.52$ and $0.015 \leq z \leq 0.1$.

2. A piezoelectric element as claimed in claim 1, characterized in that RE stands for La.

3. A piezoelectric element as claimed in claim 1, characterized in that $0.005 < u < 0.020$.

4. A piezoelectric element as claimed in claim 1, characterized in that the ceramic material also comprises 0.1 to 1.0 mol. % $5PbO.WO_3$.

5. A method of manufacturing a piezoelectric multilayer element, which method comprises the following steps:

screen printing electrode layers on a ceramic foil by means of a silver-palladium paste, stacking a number of these foils to form a multilayer, compressing and calcining the multilayer, sintering the multilayer, dividing the multilayer into individual multilayer elements, providing electrical connections on one or more side faces of the multilayer elements, polarizing the multilayer elements, characterized in that the ceramic foil comprises a ceramic material whose composition corresponds to the formula:

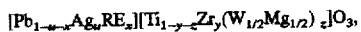
$[Pb_{1-u-x}Ag_uRE_x][Ti_{1-y-z}Zr_y(W_{1/2}Mg_{1/2})_z]O_3$, where RE is at least one element selected from the group formed by La, Nd, Sm and Gd, and in which $0<u \leq 0.025$; $0.005 \leq x \leq 0.05$; $0.44 \leq y \leq 0.52$ and $0.015 \leq z \leq 0.1$, and in that sintering is carried out at a temperature below 1150° C.

6. A method as claimed in claim 5, characterized in that the ceramic material also comprises 0.1 to 1.0 mol. % $5PbO.WO_3$.

7. A ceramic material which is suitable for use in a piezoelectric element and which is characterized in that the composition of the main component of the ceramic material corresponds to the formula:

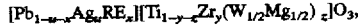
$[Pb_{1-u-x}Ag_uRE_x][Ti_{1-y-z}Zr_y(W_{1/2}Mg_{1/2})_z]O_3$, where RE is at least one element selected from the group formed by La, Nd, Sm and Gd, and in which $0<u<0.025$; $0.005 \leq x \leq 0.05$; $0.44 \leq y \leq 0.52$ and $0.015 \leq z \leq 0.1$.

8. A ceramic material as claimed in claim 7, characterized in that the ceramic material also comprises 0.1 to 1.0 mol. % $5PbO.WO_3$.

9. A ceramic material as claimed in claim 7, characterized in that RE stands for La.

10. A ceramic material as claimed in claim 7, characterized in that $0.005<u<0.020$.

11. A piezoelectric element as claimed in claim 2, characterized in that $0.005<u<0.020$.

12. A piezoelectric element as claimed in claim 2, characterized in that the ceramic material also comprises 0.1 to 1.0 mol. % $5PbO.WO_3$.

13. A piezoelectric element as claimed in claim 3, characterized in that the ceramic material also comprises 0.1 to 1.0 mol. % $5PbO.WO_3$.

14. A ceramic material as claimed in claim 8, characterized in that RE stands for La.

15. A ceramic material as claimed in claim 8, characterized in that $0.005<u<0.020$.

16. A ceramic material as claimed in claim 9, characterized in that $0.005<u<0.020$.

* * * * *